United States Patent [19]
Gisdakis et al.

[11] Patent Number: 5,899,733
[45] Date of Patent: May 4, 1999

[54] METHOD FOR THE IMPLANTATION OF DOPANT

[75] Inventors: Spyridon Gisdakis, Munich; Michaela Zellner, Taufkirchen, both of Germany

[73] Assignee: Siemens Aktiengesellschaft, Munich, Germany

[21] Appl. No.: 08/725,236

[22] Filed: Oct. 3, 1996

[30] Foreign Application Priority Data

Oct. 10, 1995 [DE] Germany .......................... 195 37 759

[51] Int. Cl.$^6$ ................................................ H01L 21/425
[52] U.S. Cl. ........................................................... 438/528
[58] Field of Search ................................... 438/528, 529, 438/514, 517; 252/520.22

[56] References Cited

U.S. PATENT DOCUMENTS

| | | | |
|---|---|---|---|
| 5,360,921 | 11/1994 | Kiso et al. .............................. | 556/478 |
| 5,426,944 | 6/1995 | Li et al. ..................................... | 62/617 |
| 5,500,095 | 3/1996 | Shinagawa et al. ......................... | 203/2 |
| 5,656,820 | 8/1997 | Murakoshi et al. ................. | 250/492.21 |

FOREIGN PATENT DOCUMENTS

0333084A2  3/1989  European Pat. Off. .

06234523A2  of 1995  Japan .

OTHER PUBLICATIONS

Handbook of "Ion Implantation Technology" J.F. Ziegler IBM–Research —1992 —pp. 435–439.

Wolf et al. "Silicon Processing for the VLSI Era Volume 1–Process Technology" pp. 308–314. Lattice Press, Sunset Beach CA, USA, 1986.

*Primary Examiner*—Charles Bowers
*Assistant Examiner*—Craig Thompson
*Attorney, Agent, or Firm*—Hill & Simpson

[57] ABSTRACT

Method for the implantation of dopant into semiconductor material, whereby a reaction gas, for example fluorine, is conducted from a gas bottle via valves and mass flow regulator into a recipient into which dopant or a chemical compound of dopant has been introduced in solid form, so that the reaction gas reacts with the dopant to form a gaseous chemical compound, and this gas is subsequently forwarded into an apparatus for the implantation. A plurality of gas bottles for employing various reaction gasses and a plurality of recipients can be employed for an implantation of different dopants in alternation.

12 Claims, 1 Drawing Sheet

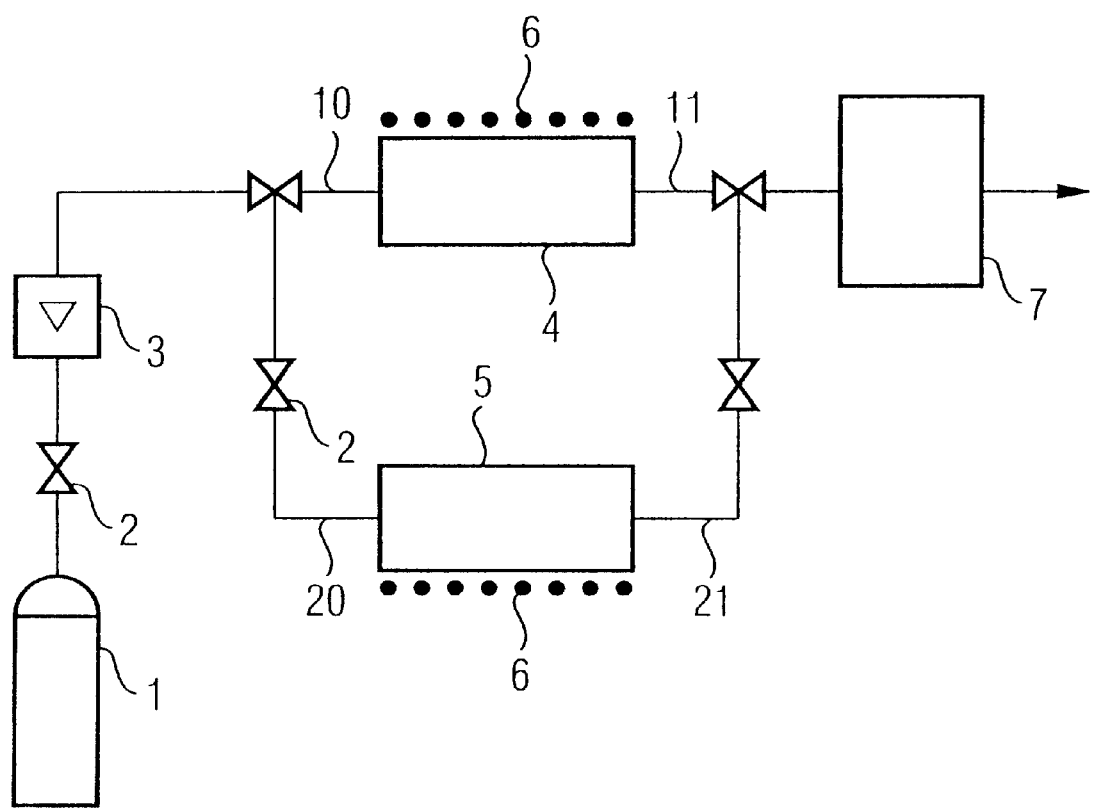

METHOD FOR THE IMPLANTATION OF DOPANT

FIELD OF THE INVENTION

The present invention is directed toward dopants for semiconductor components, and more specifically, toward methods and apparatus for doping semiconductor components.

DESCRIPTION OF THE PRIOR ART

In the manufacture of semiconductor components, the dopant is normally introduced by ion implantation. Germanium is generally required as an implant in many instances, for example in the GaAs-DIOM process. Previously, gaseous germanium tetrafluoride ($GeF_4$) was employed as initial material for this implantation. This material is extremely toxic and is no longer manufactured and stocked by the chemical industry. Therefore, $GeF_4$ is no longer commercially available.

The alternative source of germanium taught by the prior art is the use of germane ($GeH_4$). However, germane can involve difficulties because the hydrogen released in the ionization chamber of the implantation system can lead to electrical arc-overs between the electrodes. As a result, the separation of the germanium from the compound with the mass separator becomes impossible. Further, the implantation of pure germanium is practically impossible when germane is used because the masses of the various radicals respectively correspond to an isotope of the germanium.

Accordingly, a new method and apparatus for implanting germanium in semiconductor materials is required which will overcome the problem of the lack of available germanium tetrafluoride. Further, such a new method and apparatus should preferably be applicable to other dopants as well.

SUMMARY OF THE INVENTION

An object of the present invention is to specify a method for the implantation of dopant into semiconductor material that avoids the aforementioned difficulties. Another object of the present invention is to provide an improved method of implanting germanium.

Still another object of the present invention is to provide an improved apparatus for implanting dopants including, but not limited, germanium.

The present invention provides a method for the implantation of a dopant into a semiconductor material which comprises the steps of forming an intermediate compound containing the dopant by engaging a gaseous reagent with the dopant or, alternatively, a first compound containing the dopant. The method further comprises the step of delivering the intermediate compound into an apparatus containing the semiconductor material and implanting the dopant into the semiconductor material by ion implantation or another suitable method using the intermediate compound formed in the method of the present invention.

In an embodiment, the dopant is germanium.

In an embodiment, the dopant is silicon.

In an embodiment, the reagent is halogen or a halogen compound.

In an embodiment, the reagent is fluorine or a fluorine compound.

In an embodiment, the first compound containing the dopant is selected from the group of germanium halogenide, germanium sulfide and germanium oxide.

The present invention also provides an improved apparatus for implanting a dopant into a semiconductor material that comprises a front line for communicating a gaseous reagent to a reactor vessel. The reactor vessel receives the gaseous reagent and the dopant or a first compound containing the dopant and serves as a vessel for carrying out a reaction between the gaseous reagent and the dopant or the first compound containing the dopant to produce an intermediate compound. The apparatus further comprises a back line for communicating the intermediate compound from the reactor vessel to an implantation vessel or other suitable apparatus.

In an embodiment, a plurality of front lines are provided which lead to a plurality of reactor vessels which are used to produce a plurality of intermediate compounds. In an embodiment, all of the reactor vessels are connected by a back line to the implantation chamber or apparatus.

In an embodiment, a plurality of reagents may be provided and the front lines are equipped so as to alternately receive different reagent gases.

The present invention also provides a method for constructing an improved apparatus for carrying out the implantation of a dopant into a semiconductor material. The method comprises the steps of attaching a front line between a gaseous reagent supply and a reactor vessel and connecting a back line between a reactor vessel and an implantation chamber, vessel or other suitable implantation apparatus. As noted above, a plurality of reaction vessels may be connected in parallel to produce a plurality of different intermediate compounds or the same intermediate compounds. Further, the plurality of reagent supplies may be provided and alternatively supplied to the reactor vessels.

In the method of the present invention, the chemical compound that contains the dopant to be implanted is produced during the course of the implantation. The dopant to be implanted is preferably in a solid aggregate state in a recipient through which a gaseous reagent is conducted. This gas enters into a chemical reaction with the dopant resulting in the production of an intermediate chemical compound. This intermediate chemical compound is gaseous under the given conditions and is capable of being introduced into the apparatus for implantation. When germanium is the desired dopant, for example, fluorine or a fluorine compound can be conducted through this recipient. The fluorine reacts with the germanium to form germanium tetrafluoride, which can be easily conducted in gaseous form to the electrode in the ionization chamber. The other method steps of the implantation correspond to the known procedure, i.e. they comprise the steps of ionization, extraction, mass separation and re-acceleration as likewise implemented given employment of $GeF_4$ as initial material.

The apparatus of the present invention that is ideally suited for the implementation of the method of the present invention provides an arrangement comprising a reservoir for the reacting gas, a vessel for the acceptance of the dopant, preferably with a heater connected thereto, and communication lines for connecting these component parts to one another and to the ionization chamber.

BRIEF DESCRIPTION OF THE DRAWING

A description of the method and of the apparatus as well as of alternative developments follows with reference to the attached figure, wherein:

FIG. 1 is a schematic illustration of an apparatus suitable for the method of the present invention.

DETAILED DESCRIPTION OF THE PRESENTLY PREFERRED EMBODIMENTS

In the method, the reagent, for example gaseous fluorine, is conducted into the recipient from a gas bottle 1 (as shown in FIG. 1) or from a corresponding container or a delivery line. The valves 2 and 14 and a mass flow regulator 3 with which the delivery of the gas can be regulated are provided in the front line 10 that leads from the gas bottle 1 to this receiving vessel 4.

The dopant is introduced into the reactor vessel 4, preferably in a solid or, potentially, in a liquid aggregate state. The dopant can also be present in the form of a chemical compound. The supplied gas reacts chemically with the dopant or the dopant compound and forms a gaseous chemical compound of the dopant. This gas is conducted out of the vessel 4 through a back line 11 and proceeds, for example, directly into the ionization chamber 7 or some other component part of the remaining implantation apparatus. A heater 6 that can be employed to heat the dopant or the compound of the dopant as warranted. As a result thereof, first, the reaction with the supplied gas is accelerated and, second, the quantity of gas escaping from the recipient into the back line 11 can be regulated with a valve 12 in the back line 11.

Given employment of, for example, germanium as the dopant, the reagent supplied from the gas bottle can be gaseous fluorine that reacts with the germanium to form $GeF_4$. Instead of $F_2$, a gaseous fluorine compound with another element, for example $NF_3$, or a different halogen, for example $C_2l$, or a different gaseous halogen compound, or a mixture of a halogen with an inert gas, for example fluorine with helium, argon, neon, etc., can be employed as reagent. The admixture of an inert gas has the particular advantage that the ion plasma employed in the implantation is thereby stabilized.

The dopant, for example germanium, can be introduced into the vessel 4 as amorphous, monocrystalline or polycrystalline solid material. Instead of being employed as element, the dopant can also be employed in the form of a compound, for example as germanium halogenide, germanium sulfide or germanium oxide given germanium. Instead of germanium as dopant, this method can also be applied given other dopants such as, for example, silicon. Correspondingly, silicon or a silicon compound is introduced into the recipient, preferably in solid form.

Given the described method, it is possible in a simplified way to successively implant various elements given employment of only one reagent, which is preferably supplied as a gas. The arrangement shown in FIG. 1 is especially suitable for this purpose. A second reactor vessel 5, which is likewise provided with a heater 6, is provided. A second front line 20, which discharges into this second vessel 5, is connected to the front line 10 via the valve 13 through which the supplied gas can be alternatively conducted into the one recipient 4 or into the other recipient 5. The gaseous chemical compound formed in the second recipient 5 by a chemical reaction is conducted through a connected, second back line 21 and a valve 15, before being conducted into the apparatus 7 for implantation. A second, third, fourth, etc., recipient can likewise be present in order to be able to successively implant a plurality of different elements upon employment of the same reagent. The system and the method, however, are not limited to the employment of only one reagent. For example, a plurality of gas bottles with different reaction gasses can be connected to the front line 10 via valves so that respectively one of the reagents can be conducted into the recipient in alternation.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A method for implantation of a dopant into a semiconductor material, the method comprising the following steps:

forming a gaseous intermediate compound containing the dopant in a first reactor by engaging a gaseous reagent with a first material containing the dopant, the first material being in a non-gaseous form, delivering the intermediate compound into an ionization chamber containing the semiconductor material, the first reactor being connected to the ionization by a conduit comprising a valve for controlling the delivery of the gaseous intermediate compound to the ionization chamber, implanting the dopant in the semiconductor material in the ionization chamber.

2. The method of claim 1 wherein the dopant is germanium.

3. The method of claim 1 where in the dopant is silicon.

4. The method of claim 1 wherein the reagent is a halogen.

5. The method of claim 1 wherein the reagent is a halogen compound.

6. The method of claim 1 wherein the reagent is fluorine.

7. The method of claim 1 wherein the reagent is a fluorine compound.

8. The method of claim 1 wherein the first compound containing the dopant is selected from the group consisting of germanium halogenide, germanium sulfide and germanium oxide.

9. The method of claim 1 wherein the first material is selected from the group of an amorphous germanium, a monocrystalline germanium, a polycrystalline germanium, a germanium halogenide, germanium sulfide and germanium oxide.

10. A method for the implantation of a dopant into a semiconductor material that eliminates any separate handling of the dopant in a gaseous metallic halide form, the method comprising the following steps:

forming a gaseous metallic halide in a reactor vessel by contacting the dopant in a solid form with a halogen gas, the reactor being connected to an ionization chamber by a conduit comprising a valve, delivering the gaseous metallic halide to the ionization chamber containing the semiconductor material through the conduit and controlling the flow of gaseous metallic halide by adjusting the valve, implanting the dopant in the semiconductor material.

11. The method of claim 10 wherein the solid form of the dopant is selected from the group consisting of crystalline germanium, germanium sulfide and germanium oxide, and the halogen gas is fluorine.

12. A method for the implantation of a dopant into a semiconductor material that eliminates any separate handling of the dopant in a gaseous metallic halide form, the method comprising the following steps:

forming a gaseous metallic halide in a reactor vessel by contacting the dopant in a liquid form with a halogen gas, the reactor being connected to an ionization chamber by a conduit comprising a valve, delivering the gaseous metallic halide to the ionization chamber containing the semiconductor material through the conduit and controlling the flow of gaseous metallic halide by adjusting the valve, implanting the dopant in the semiconductor material.

* * * * *